United States Patent
Otsuki et al.

(10) Patent No.: US 7,405,934 B2
(45) Date of Patent: Jul. 29, 2008

(54) FAN AND COOLING APPARATUS

(75) Inventors: Takaya Otsuki, Kyoto (JP); Takamasa Yamashita, Kyoto (JP)

(73) Assignee: Nidec Corporation, Kyoto (JP)

( * ) Notice: Subject to any disclaimer, the term of this patent is extended or adjusted under 35 U.S.C. 154(b) by 0 days.

(21) Appl. No.: 11/373,180

(22) Filed: Mar. 13, 2006

(65) Prior Publication Data

US 2006/0201658 A1   Sep. 14, 2006

(30) Foreign Application Priority Data

Mar. 14, 2005   (JP) .............................. 2005-071809

(51) Int. Cl.
*H05K 7/20* (2006.01)
*F28F 7/00* (2006.01)

(52) U.S. Cl. ...................... 361/697; 361/695; 361/704; 361/709; 165/80.3; 165/104.33; 415/213.1; 417/423.15

(58) Field of Classification Search ................. 361/695, 361/697, 694, 704; 415/213.1, 214.1; 416/244 R, 416/247 R; 165/122, 104.33, 185; 417/360, 417/423.15; 425/522
See application file for complete search history.

(56) References Cited

U.S. PATENT DOCUMENTS

| | | | | |
|---|---|---|---|---|
| 5,335,722 A | * | 8/1994 | Wu ............................. | 165/122 |
| 5,421,402 A | * | 6/1995 | Lin ............................. | 165/80.3 |
| 5,498,130 A | * | 3/1996 | Wakley et al. ............. | 415/213.1 |
| 5,522,700 A | * | 6/1996 | Hong ......................... | 415/177 |
| 5,566,749 A | * | 10/1996 | Jordan et al. ............... | 165/80.3 |
| 5,612,677 A | * | 3/1997 | Baudry ...................... | 340/584 |
| 5,734,553 A | * | 3/1998 | Hong ......................... | 361/697 |
| 5,943,209 A | * | 8/1999 | Liu ............................ | 361/695 |
| 6,116,120 A | * | 9/2000 | Boe ........................... | 81/163 |
| 6,130,820 A | * | 10/2000 | Konstad et al. ............ | 361/695 |
| 6,179,046 B1 | * | 1/2001 | Hwang et al. .............. | 165/80.3 |
| 6,311,766 B1 | * | 11/2001 | Lin et al. .................... | 165/80.3 |
| 6,392,885 B1 | * | 5/2002 | Lee et al. ................... | 361/697 |
| 6,520,250 B2 | * | 2/2003 | Lee et al. ................... | 165/121 |
| 6,538,888 B1 | * | 3/2003 | Wei et al. ................... | 361/697 |
| 7,123,483 B2 | * | 10/2006 | Otsuki et al. .............. | 361/710 |
| 7,221,567 B2 | * | 5/2007 | Otsuki et al. .............. | 361/695 |

FOREIGN PATENT DOCUMENTS

| | | |
|---|---|---|
| JP | 2002-110877 | 4/2002 |
| JP | 2002-134972 | 5/2002 |
| JP | 2002134972 A * | 5/2002 |

* cited by examiner

*Primary Examiner*—Jayprakash N Gandhi
*Assistant Examiner*—Robert J Hoffberg
(74) *Attorney, Agent, or Firm*—Westerman, Hattori, Daniels & Adrian, LLP.

(57) ABSTRACT

Holding arms of a frame member of a fan axially extend and project outward from both sides of a housing in a direction perpendicular to a rotational axis of the fan. Catch projections are provided on inner surface of the axial ends of the holding arms in a front-rear direction perpendicular to the axial direction and the aforementioned direction. The catch projections are arranged without being covered by or covering other portions in the frame member axially.

6 Claims, 9 Drawing Sheets

FAN AND COOLING APPARATUS

BACKGROUND OF THE INVENTION

1. Field of the Invention

The present invention relates to a fan having holding arms to be attached to a heat sink, and a cooling apparatus in which a heat sink and the fan attached to the heat sink. More particularly, the present invention relates to a molding die assembly for molding a frame member as a portion of the fan, and a method of manufacturing the frame member by using the molding die assembly.

2. Description of the Related Art

A typical CPU or MPU installed in a computer generates much heat during operation. The CPU or MPU has to be cooled so that its temperature is kept in a predetermined range. A cooling apparatus in which a fan is attached to a heat sink is used for cooling the CPU or MPU. The fan of this cooling apparatus has holding arms for attaching the fan to a heat sink.

In an exemplary fan of a cooling apparatus, holding arms of a fan housing are provided so as to face each other in a predetermined direction perpendicular to an axial direction of the fan, and extend parallel to the axial direction of the fan. Each holding arm has a catch projection at its tip. The catch projection is provided on an inner surface of the holding arm in the above predetermined direction for securing the fan to a corresponding portion of the heat sink from outside.

In this case, however, the catch projection of the holding arm catches the heat sink with an inward force in the predetermined direction at a position axially outside the fan housing. Thus, stability of attachment of the fan to the heat sink is not always sufficient.

Moreover, formation of the fan housing having the holding arm with the aforementioned catch projection by molding using a molding die assembly requires not only a die piece movable in the axial direction of the resultant fan housing but also a die piece movable in a direction perpendicular to the axial direction, in order to open the molding die assembly and allow removal of the resultant fan housing from the molding die assembly. Thus, the configuration of the molding die assembly becomes complicated. This prevents reduction in the manufacturing cost of the fan including that fan housing and a cooling apparatus in which the fan is attached to a heat sink, and also prevents improvement of manufacturing efficiency such as manufacturing speed.

In order to form the catch projection by using axially movable die pieces only, it is necessary for the die pieces to include an elongated pin-shaped portion for forming the axially upper surface of the catch projection. In this case, a hole through which the pin-shaped portion passes is inevitably formed in a portion of the resultant fan housing or holding arm located axially above the catch projection. The die piece having the pin-shaped portion can be easily broken and therefore the die life is short. In addition, the resultant fan housing has a drawback that the strength of a base portion of the holding arm is low due to the hole.

BRIEF SUMMARY OF INVENTION

According to the present invention, a fan has a feature in a shape of holding arms and a position at which a catch projection is formed.

The catch projection is formed at an end of each holding arm and projects toward the other holding arm. This feature reduces the width of the fan and is favorable for installing the fan into a limited space. The holding arm with a projection, however, is often difficult to mold because the projection becomes an obstacle to remove a die.

The holding arms of the present invention extend parallel to the rotation axis of the impeller. It means that the die placed between the holding arms can be removed by sliding the die along the rotation axis if the die is not stumbled by the catch projection.

Since the catch projection is formed outside an imaginary surrounding wall of the fan, which axially extends from the outer periphery of the housing, the die assembly can be separated into die pieces without interfering with each other. A die at the place of the projection can be moved toward housing along the rotation direction whereas a die at the place below the housing can be moved along a direction opposite toward the housing.

Thus, the fan can be manufactured without making the configuration of a molding die assembly complicated, and reduction in the manufacturing cost and improvements in the manufacture efficiency such as manufacturing speed can be achieved.

Other features, elements, steps, advantages and characteristics of the present invention will become more apparent from the following detailed description of preferred embodiments thereof with reference to the attached drawings.

DETAILED DESCRIPTION OF INVENTION

An embodiment of the present invention is now described with reference to FIGS. 1 to 9.

Figure 1:
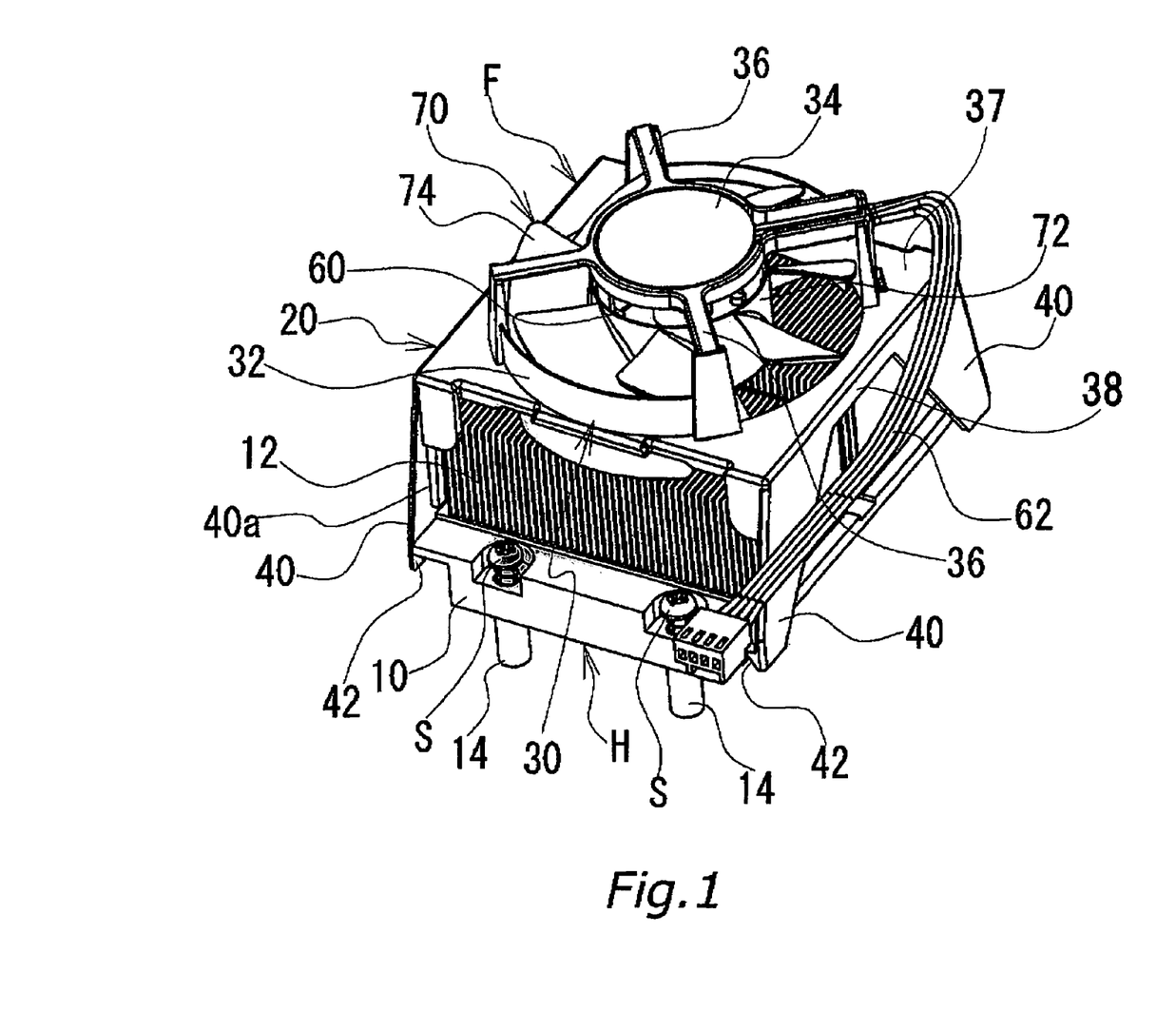
FIG. 1 is a perspective view of a cooling apparatus according to an embodiment of the present invention.
Figure 2:
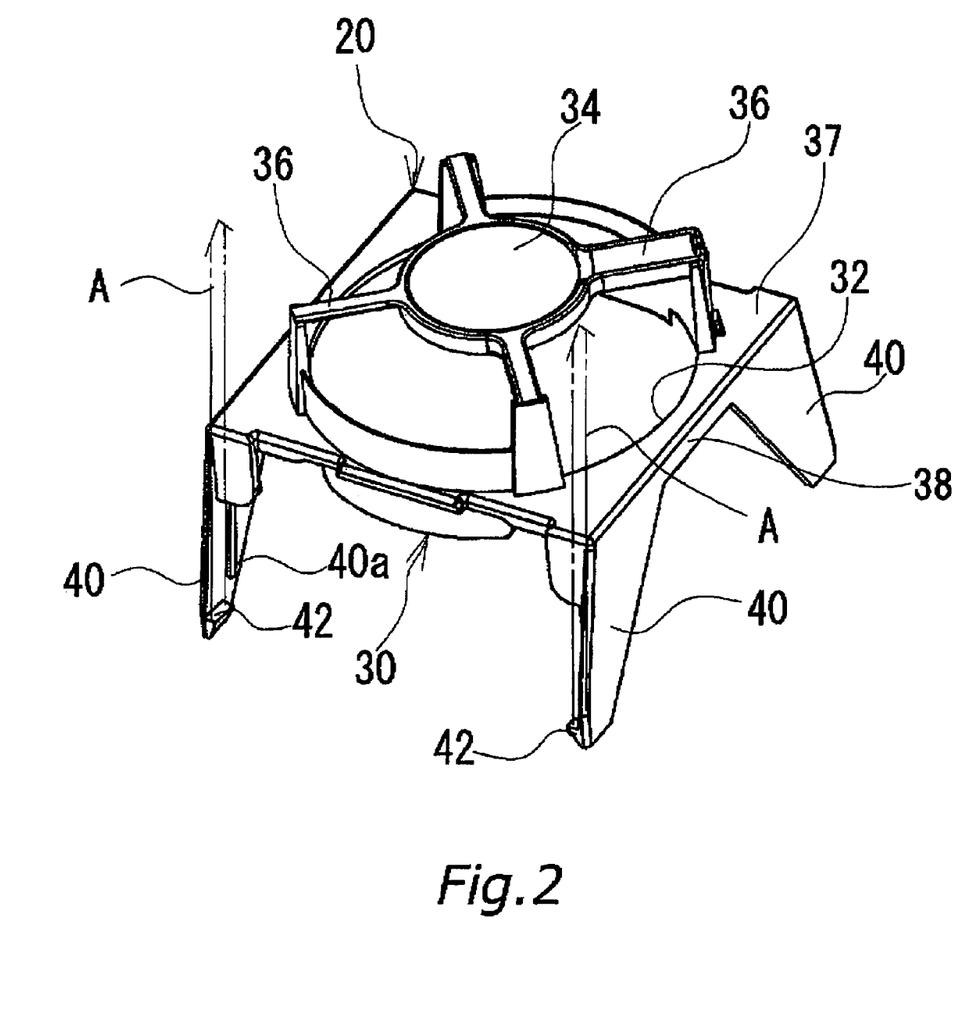
FIG. 2, FIG. 3, and FIG. 4 are perspective views of a frame member of a fan of the cooling apparatus of FIG. 1.
Figure 3:
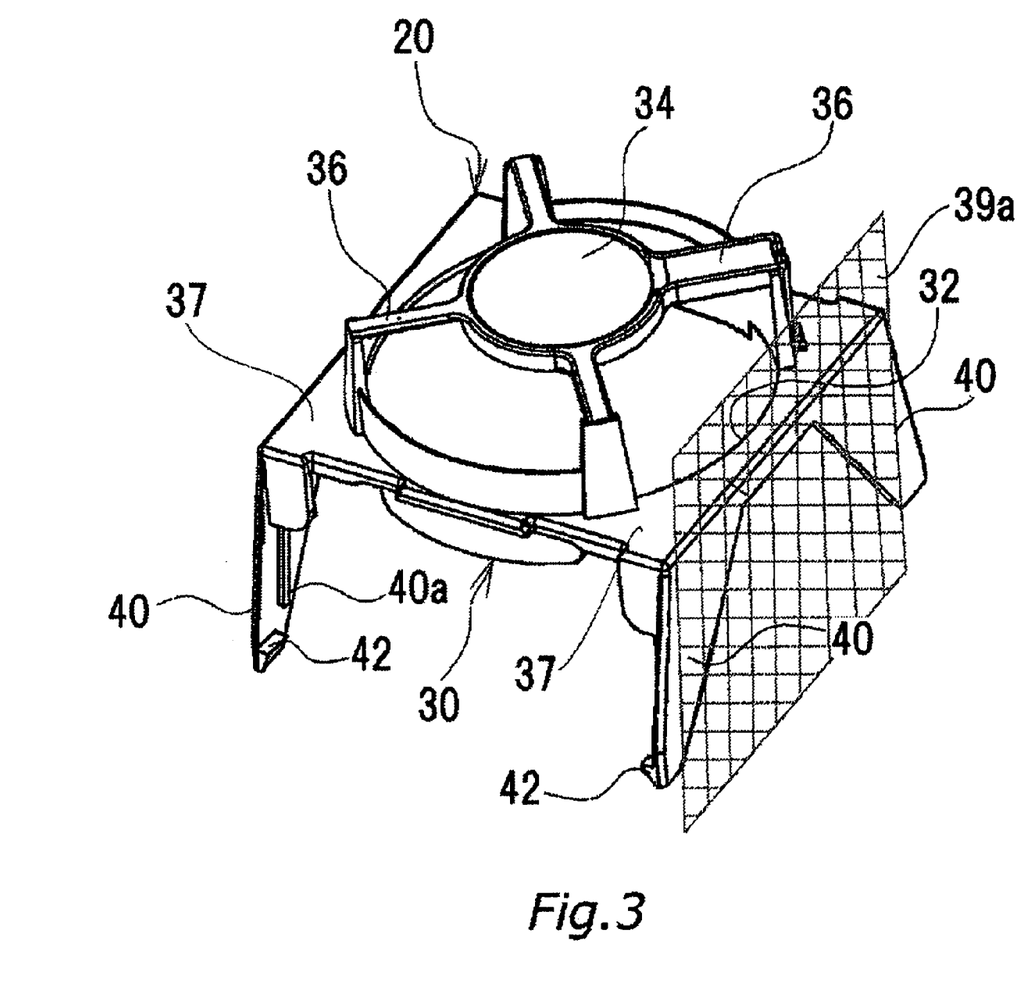
Figure 4:
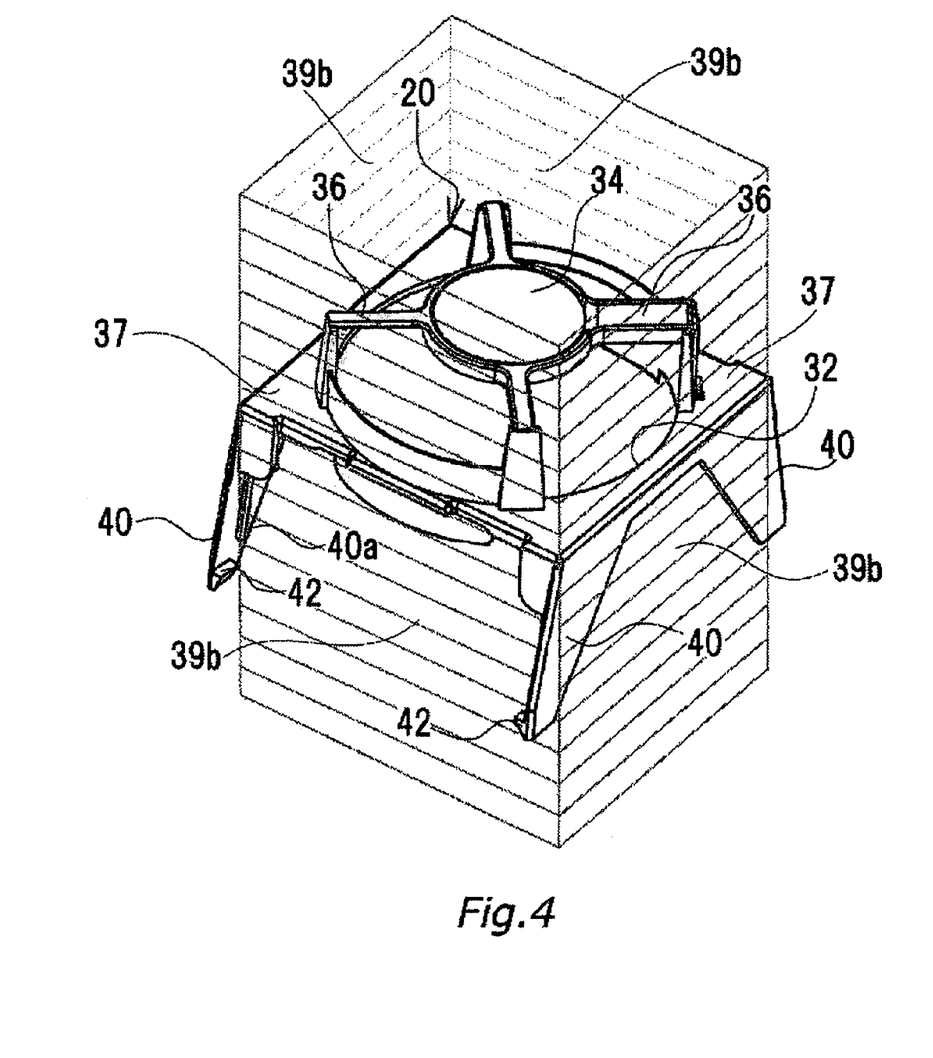

FIGS. 1 to 6 show a cooling apparatus according to an embodiment of the present invention. FIG. 1 is a perspective view of the cooling apparatus of this embodiment. FIGS. 2, 3, and 4 are perspective views of a frame member of a fan of the cooling apparatus of FIG. 1. FIGS. 5, 6, 7, and 8 are a front view, a side view, a plan view, and a bottom view of the cooling apparatus of FIG. 1.

The cooling apparatus is used for cooling a CPU or MPU and includes a heat sink H and an axial fan F for cooling the heat sink H. The cooling apparatus of the present invention can be used for cooling devices other than CPUs and MPUs. The fan of the present invention can be attached to and used with an object other than the heat sink.

In the heat sink H, a number of radiator fins 12 stand parallel to each other on a base 10. The heat sink H is made of a material having high thermal conductivity. The base 10 has a square shape in plan view and has support legs 14 for fixing the heat sink H (or cooling apparatus) to a board to which a CPU or MPU is attached. The heat sink H is fixed to the board such that the lower surface of the base 10 is in contact with the CPU or MPU and the heat of the CPU or MPU can be conducted to the heat sink H efficiently.

The fan F mainly has a frame member 20, a motor (driving mechanism) 60, and an impeller 70. The frame member 20 and the impeller 70 are made of plastic.

Figure 9:
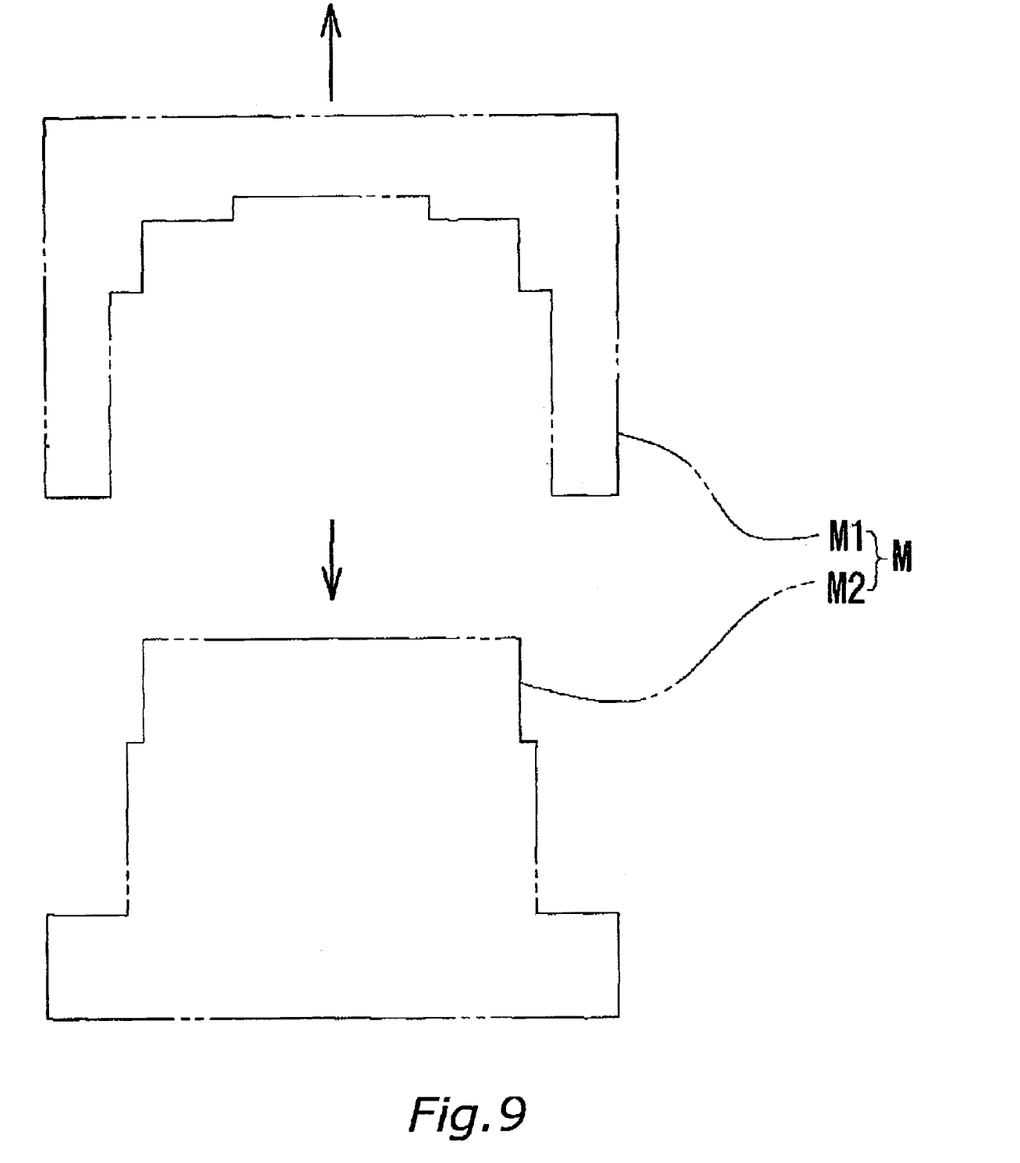
FIG. 9 is a schematic view of a die for injection molding.

The frame member 20 has a housing 30 and holding arms 40 (including catch projections 42). The frame member 20 is integrally molded in the cavity of an injection molding die M formed by a first die piece M1 and a second die piece M2, as shown in FIG. 9. The frame member 20 has such a shape that it can be removed from the die M by separating the first and second die pieces M1 and M2 from each other in an axial direction of the frame member 20 substantially without being deformed. The frame member 20 may be removed from the die M by other techniques instead of moving the first and second die pieces M1 and M2.

The housing 30 includes: a housing cylindrical portion 32 having an approximately circular inner cross section perpendicular to the rotational axis; a motor supporting portion 34 for supporting the motor 60 at a center on an air-inlet side (the upper side in FIGS. 1 and 5) of the housing cylindrical portion 32; ribs 36 supporting the motor supporting portion 34 by connecting the motor supporting portion 34 to the housing cylindrical portion 32; and a housing extension portion 37 which extends outwardly from the housing cylindrical portion 32. The periphery of the extension portion 37 defines the outer periphery 38 of the housing 30.

A hub 72 of the impeller 70 is fixed to a rotor of the motor 60. When the rotor rotates via a bearing mechanism, the hub 72 and blades 74 attached to an outer surface of the hub 72 are rotated, thereby creating an air toward an air-outlet port (i.e., toward lower side in FIGS. 1 and 5). A plurality of lead wires 62 having a connector at their ends extend from the motor 60.

Figure 5:
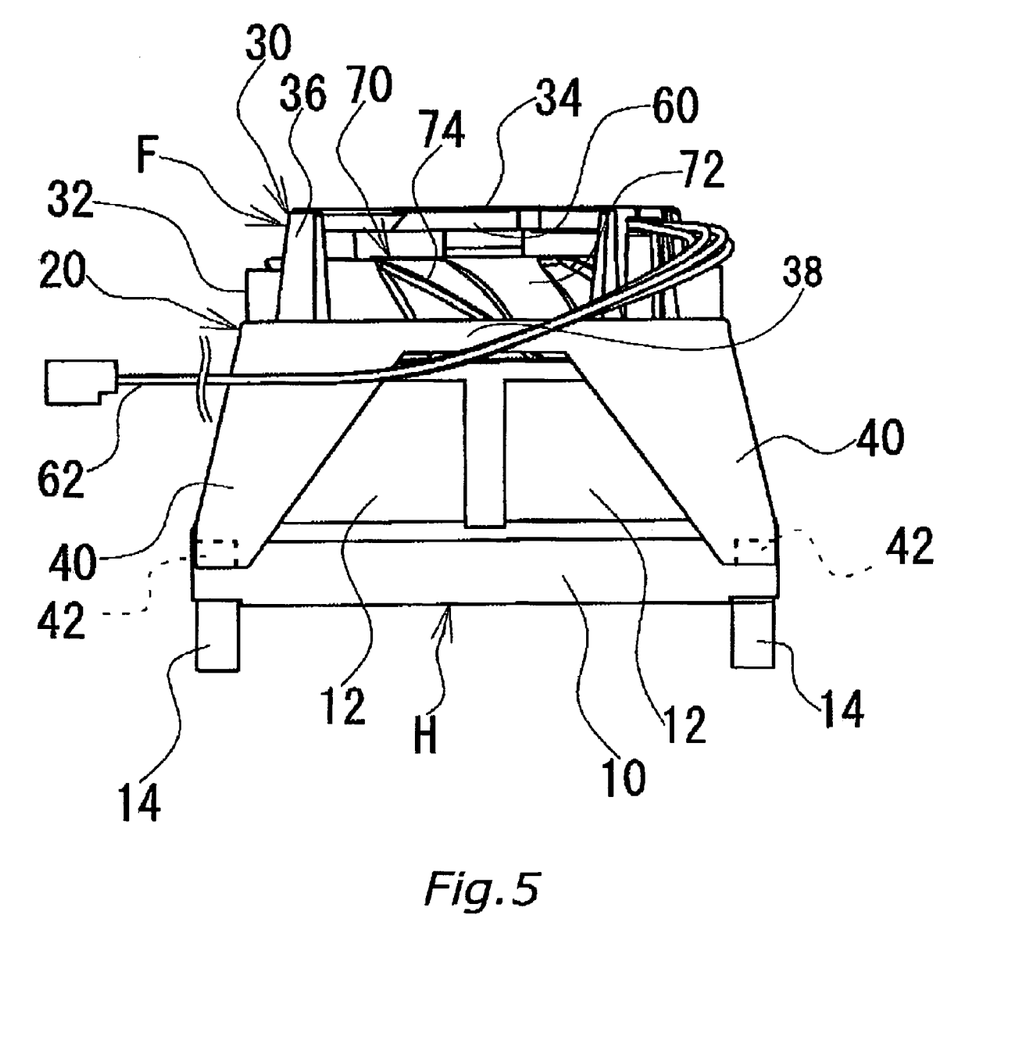
FIG. 5 is a front view of the cooling apparatus of FIG. 1.
Figure 6:
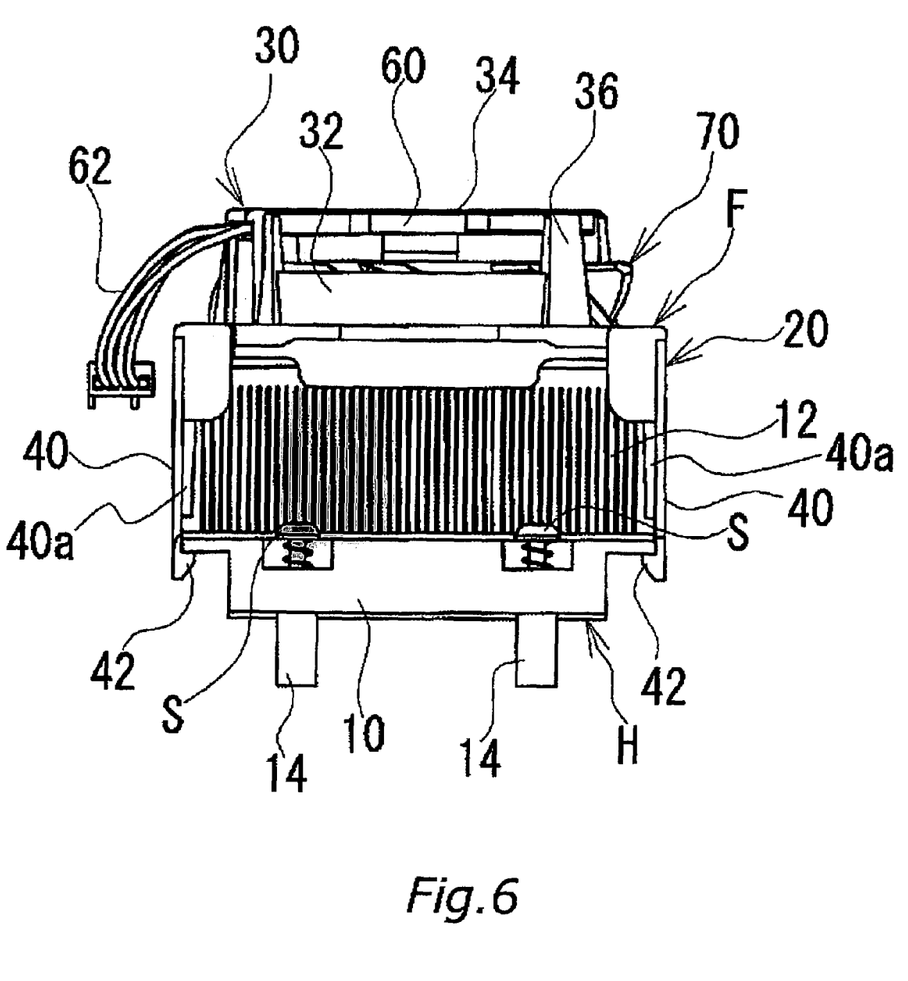
FIG. 6 is a side view of the cooling apparatus of FIG. 1.

The holding arms 40 can attach the fan F to the heat sink H. Each holding arm 40 has a plate shape and extends from the outer periphery of the housing 30 parallel to the axial direction and a lateral direction perpendicular to the axial direction. A pair of holding arms 40 is provided on each of the front and rear sides of the housing 30 (i.e., each of opposing sides of the housing 30 in a front-rear direction which is perpendicular to the axial direction of the fan F and the lateral direction). The holding arms 40 axially extend toward the air-outlet side of the fan F and project outward on both sides of the housing 30 in the lateral direction perpendicular to both the axial direction and the front-rear direction. Each holding arm 40 is tapered and inclined outward in the lateral direction toward its tip, as shown in FIGS. 1 and 5. On the inside of each of the holding arms 40 in the front-rear direction, a reinforcing rib 40a is provided to extend along the axial direction. The reinforcing rib 40a prevents distortion of the holding arm 40 during molding and also reinforces the holding arm 40 after molding.

The holding arm 40 does not always have to be linearly inclined and extend. For example, the holding arm 40 may be curved or bent to project to the outside of the housing 30 in the lateral direction.

The catch projection 42 is provided on an inner surface of the tip of each holding arm 40 in the front-rear direction. The tip, i.e., an axial end of each holding arm 40 is located outside the housing 30 in the lateral direction. The fan F is attached to the heat sink H with four holding arms 40 surrounding the group of the radiator fins 12. The air-outlet side of the impeller 70 is positioned above the group of the radiator fins 12 of the heat sink H. The group of the radiator fins 12 is mainly cooled by air blown from the air-outlet of the fan F by rotation of the impeller 70. A pair of the catch projections 42 is provided on each side of the group of radiator fins 12 in the front-rear direction. The catch projections 42 catch lower portions of four corners (caught portions) of the base 10 of the heat sink H from the front and rear. Since the catch projections 42 of the holding arms 40 catch the heat sink H with an inward force in the front-rear direction at the positions outside the housing 30 in the lateral direction, the fan F can be attached to the heat sink H more stably.

The catch projections 42 are provided at the axial ends of the respective holding arms 40 outside the housing 30 in the lateral direction. Other portions of the frame member 20 are not located axially above the catch projections 42. (Please note the axial direction is the vertical direction in FIGS. 1 to 5, and is indicated by alternate long and short dash arrows A in FIG. 2. In FIG. 2, the alternate long and short dash arrows A are shown for only two of the four catch projections 42, but the directions of the other two catch projections 42 are the same). Therefore, no other portions of the frame member 20 are located axially above the catch projections 42 with a space therebetween. Thus, the top face of each of the catch projections 42 can be seen when the frame member 20 is seen from above in the axial direction.

FIGS. 3 and 4 show the arrangement of the aforementioned catch projection 42 more precisely using imaginary planes 39a and an imaginary surrounding wall 39b. Each of the imaginary planes 39a extends parallel to the rotational axis of the impeller 70 and contains a portion of the outer periphery 38 of the housing 30. The holding arm 40 axially extends on the corresponding imaginary plane 39a. The holding arm 40 may be curved or bent with its axial end located outside the housing 30 in the lateral direction as long as the holding arm 40 is located on the imaginary plane 39a. The imaginary surrounding wall 39b axially extends, contains the outer periphery 38, and has the same shape of cross section perpendicular to the rotational axis as the shape of cross section of the hollow surrounded by the outer periphery 38 at any point in the axial direction. The catch projection 42 is formed outside the imaginary surrounding wall 39b and between the imaginary planes 39a.

With this configuration, the whole frame member 20 including the catch projections 42 can be formed in such a shape that the frame member 20 can be removed from the die without any substantial deformation by axially separating the first and second die pieces M1 and M2 from each other. Therefore, the frame member 20 can be manufactured without making the molding die assembly M complicated, resulting in reduction in the manufacturing cost of the fan F and improvements in manufacturing efficiency such as manufacturing speed. The catch projections 42 can be molded by relatively thick portions of the molding die assembly M, and it is unnecessary to provide an elongated pin portion in, for example, the first die piece M1. Thus, damage of the molding die assembly M caused by breakage of the pin-shaped part can be prevented, so that the life of the molding die assembly M can be increased. Since a through hole for molding the catch projection 42 is not formed in the frame member 20, the strength in the base portion (the upper portion in FIGS. 1 to 5) of the holding arms 40 in the frame member 20 is not lowered.

Moreover, the catch projections 42 are provided on the inner surfaces of the holding arms 40 in the front-rear direction. Therefore, the distance between the opposing holding arms 40 in the front-rear direction is wider than that of the opposing catch projections 42 in the front-rear direction perpendicular to the axial direction. Consequently, the cooling effect can be maximized by maximizing the width of a portion of the heat sink H which is to be cooled by air flow from the air outlet of the axial fan F, between the holding arms 40.

Figure 7:
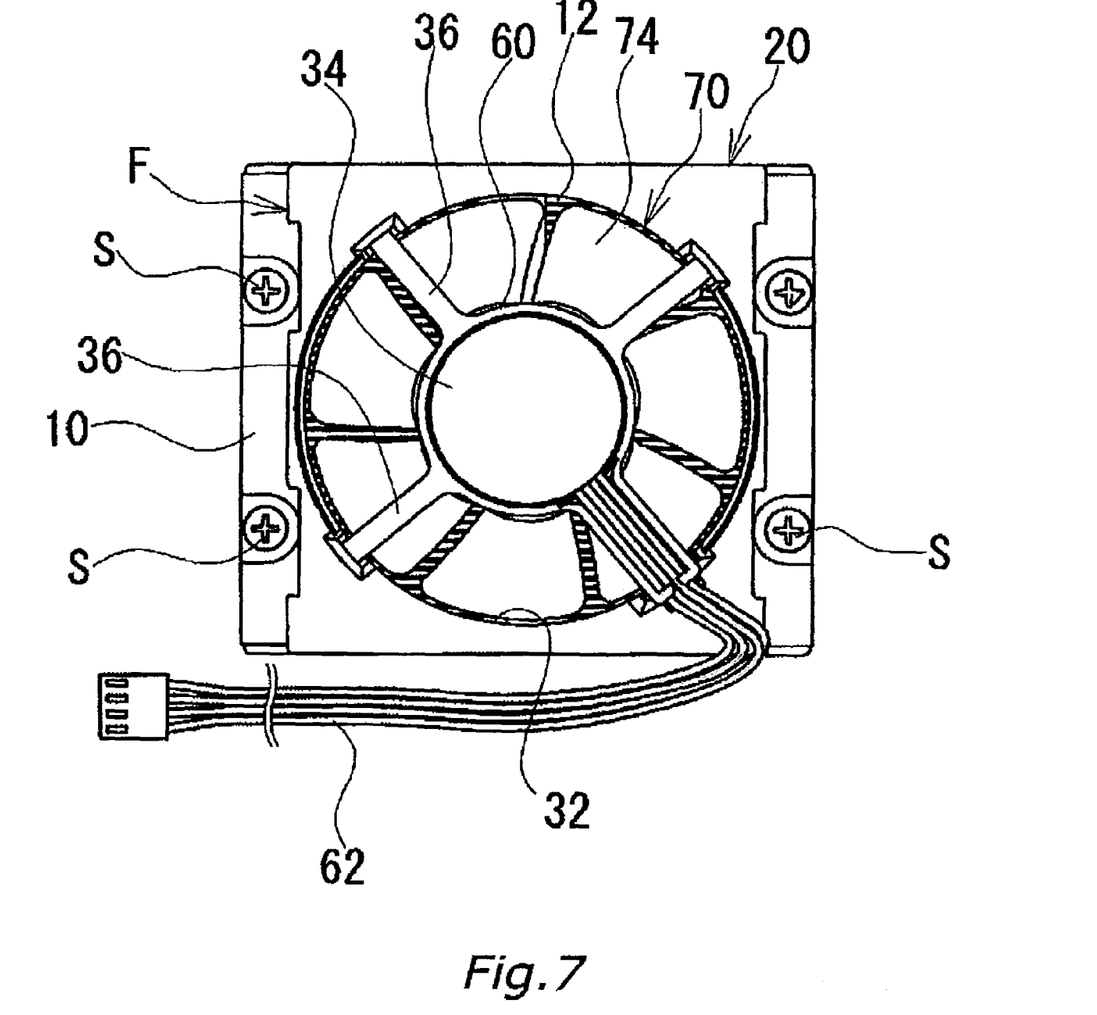
FIG. 7 is a plan view of the cooling apparatus of FIG. 1.
Figure 8:
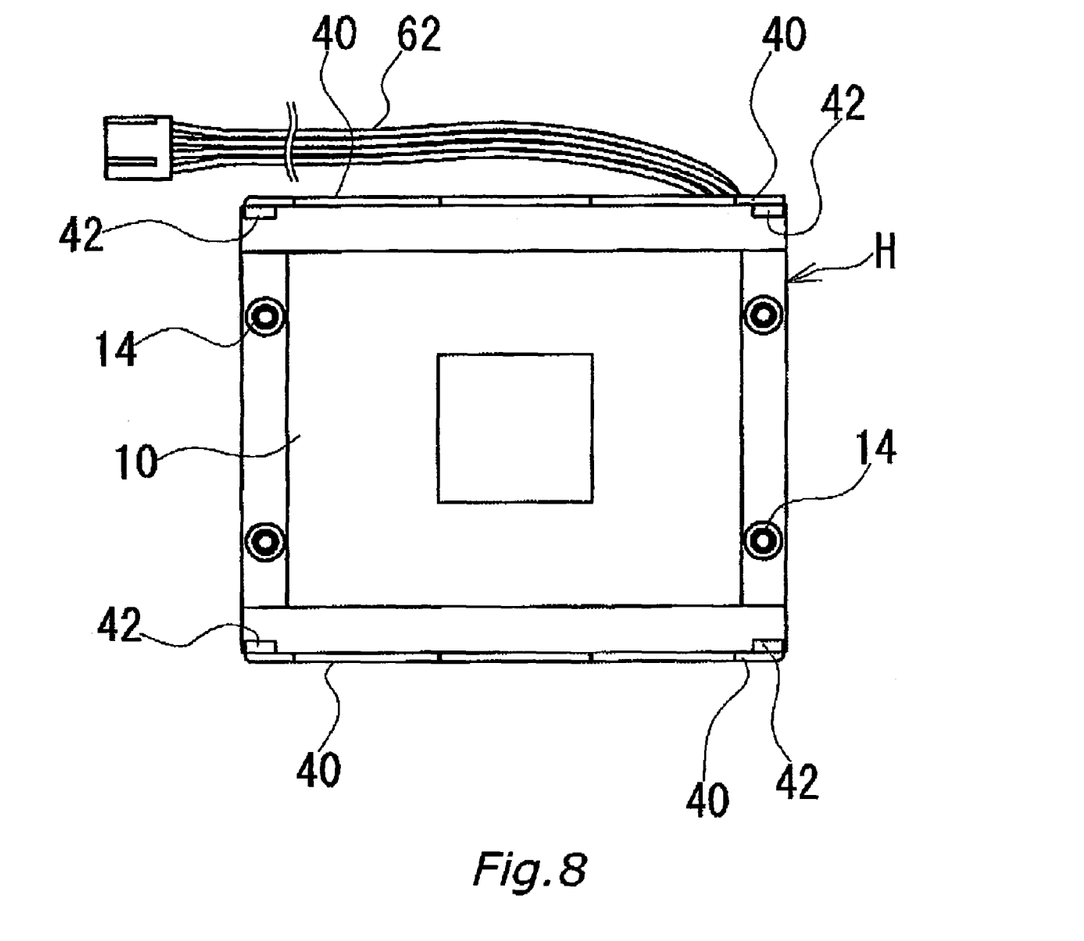
FIG. 8 is a bottom view of the cooling apparatus of FIG. 1.

In this embodiment, screw holes (fixing portion) for fixing the heat sink H to an object to be used with the heat sink H are formed in the base 10, as shown in FIG. 1. In this case, the screw holes are arranged between portions of the holding arms 40 in the front-rear direction. Since the screw holes are arranged such that screws S placed in the screw holes are uncovered as shown in FIG. 7, the fan F does not become a substantial obstacle for fixing the heat sink H to the other object with the screws S in the axial direction. Thus, the arrangement of the screw holes in this embodiment is advantageous for fixing work.

The positional relationships in the vertical direction in the above description are merely used for convenience of description based on the drawings, but do not limit actual use states and the like.

The material of the frame member in the present invention is not limited to plastic. Any material which can be molded into the frame member by the molding die assembly M can be used, as long as it does not hinder the above effects of the present invention. The present invention does not preclude the use of material in addition to the molding materials for forming the frame member, for example, in insert molding.

In the present invention, one holding arm 40 or three or more holding arms 40 can be provided on each of the opposing sides of the housing 30 in the front-rear direction perpendicular to the predetermined direction. The number of the holding arms 40 on each side of the housing 30 is not limited to one pair.

Further, the form of the heat sink H is not limited to the above form. Any form can be used as long as it is suitable for cooling using the fan F. Please note that the fan F can cool an object to be cooled by discharging air toward the object or suctioning air around the object.

The caught portions of the heat sink H caught by the catch projections of the holding arms are not limited to lower portions of the four corners of the base but may be other portions such as portions of the radiator fin. For example, the catch projections may be received in a recess formed in the heat sink or catch a projection formed on the heat sink.

As described above, the fan of the present invention has a pair of holding arms which can attach the fan to an object to which the fan is to attached. The pair of holding arms extends from the periphery of the extension portion of the housing to one side in the axial direction. At least a portion of the holding arm is located at a position which is farther from the rotary axis of the fan than the periphery of the extension portion.

The catch projection projects from the holding arm to the other holding arm and is located at a position which is farther from the rotary axis of the fan than the outer periphery of the extension portion of the housing.

Thus, the catch projection of the holding arm can catch the object to which the fan is to be attached at a position located on the other holding arm side of the holding arm. This increases stability of attachment of the fan to the attachment object.

It is preferable that the housing, the holding arms, and the catch projections be formed integrally with one another in the cavity of a molding die assembly formed by a plurality of die pieces which can be separated from each other in a certain direction without causing any substantial deformation of the integrally molded part.

The "certain direction" is a direction in which one or more of the die pieces (for example, when the molding die assembly is constructed by two die pieces, one of the die pieces and, when the molding die assembly is constructed by three or more die pieces, one or more die pieces out of the three or more die pieces) is separated from the remaining die piece(s), thereby enabling the integrally molded part having portions serving as the housing, the holding arms, and the catch projections to be removed from the cavity of the molding die assembly without any substantial deformation. The die piece may have any shape, size, and the like.

The catch projection projects from one of the holding arms which extend from the outer periphery of the extension portion of the housing to one side in the axial direction, toward the other holding arm. At least a portion of each holding arm is located farther from the rotary axis than the periphery of the extension portion. Each catch projection has such a shape that the integrally molded frame member including the housing and the holding arms with the catch projections can be removed from the die without any substantial deformation by separating part of the die pieces, which is located farther from the rotary shaft than the periphery of the extension portion, from the other die pieces.

Thus, a fan including a holding arm having a catch projection to be attached to an object can be manufactured without making the configuration of a molding die assembly complicated, and reduction in the manufacturing cost of the fan and improvements in the manufacture efficiency such as manufacturing speed can be realized.

Since the holding arm has the catch projection which projects from one holding arm to another holding arm and is a position farther from the rotation axis than the periphery of the extension portion of the housing, the distance between the opposing holding arms is larger than the distance between the opposing catch projections in a predetermined direction.

The fan of the present invention may be an axial fan.

In this case, the distance between the opposing holding arms is wider than the distance between the opposing catch projections in the direction with larger distance from the rotation axis, the width in the predetermined direction between the holding arms in which air is blown by the axial fan arranged with its axial direction coincident with the predetermined direction can be maximized.

The cooling apparatus of the present invention includes a heat sink and the above-described fan for cooling the heat sink. The heat sink has a caught portion capable of caught by the catch projection of the fan. The fan is attached to the heat sink with the catch projection catching the caught portion.

Since the housing including the holding arms with the catch projections each projecting from one holding arm to the opposing holding arm can be manufactured without making the configuration of a molding die assembly complicated, it is possible to reduce the manufacturing cost of the cooling apparatus in which the fan is attached to the heat sink with the catch projection catching the caught portion of the heat sink and to improve the manufacture efficiency such as manufacturing speed.

Since the distance between the opposing holding arms is wider than the distance between the opposing catch projections in a predetermined direction with larger distance from the rotation axis, the width in the predetermined direction of a portion in which the heat sink is cooled by the air blown from the axial fan can be maximized between the opposing holding arms, and the cooling effect can be maximized.

A molding die assembly of the present invention is made by a plurality of die pieces assembled to form a cavity in which the housing, the holding arms, and the catch projections can be integrally formed with one another. The die assembly has a shape allowing the housing, the holding arms, and the catch projections to be removed therefrom without any substantial deformation of the housing, the holding arms, and the catch projections by separating a part of the die pieces from the other die pieces in the predetermined direction. The use of the molding die assembly can reduce the manufacturing cost of the fan and improve manufacturing efficiency such as manufacturing speed. Since it is unnecessary to provide an elongated pin-shaped part for forming the catch projection, the die is prevented from being damaged by breakage of the pin-shaped part, the life of the die can be increased.

A fan manufacturing method of the present invention includes: integrally molding a housing, holding arms, and catch projections in a cavity of a molding die assembly; and removing the housing, holding arms, and the catch projections from the molding die by separating part of die pieces the molding die assembly from the other die pieces in the predetermined direction. According to this manufacturing method, reduction in the manufacturing cost of the fan and improvements in manufacturing efficiency such as manufacturing speed can be realized.

While the present invention has been described with respect to preferred embodiments, it will be apparent to those skilled in the art that the disclosed invention may be modified in numerous ways and may assume many embodiments other than those specifically set out and described above. Accordingly, it is intended by the appended claims to cover all modifications of the present invention which fall within the true spirit and scope of the invention.

What is claimed is:

1. A fan comprising:
   an impeller rotatable about an axis extending in a first direction;
   a motor to rotate the impeller; and
   an integrally molded member, comprising:
      a housing for supporting the motor, comprising a frame member extending in a second direction perpendicular to the first direction, the frame member having an outer periphery including a first linear side and a second linear side parallel to the first linear side;
      a first holding arm having a first surface extending in the first direction from the first linear side;
      a second holding arm having a second surface extending in the first direction from the second linear side, the first surface being parallel to the second surface;
      a first catch projection extending in the second direction from a first lower end of the first surface toward the second surface; and
      a second catch projection extending in the second direction from a second lower end of the second surface toward the first surface, the first catch projection being opposed to and parallel to the second catch projection;
   wherein an imaginary surrounding wall extends to surround the outer periphery, the imaginary surrounding wall being perpendicular to the second direction,
   wherein the first and second catch projections are located outside the imaginary surrounding wall, and
   wherein a line extending from the first and second catch projections along the first direction is not blocked by any other portion of the integrally molded member.

2. A fan according to claim 1, wherein the housing further comprises a housing cylindrical portion formed in the frame member; a motor supporting portion, and a rib connecting the motor supporting portion to the housing cylindrical portion.

3. A fan according to claim 1, wherein a distance between the first and second holding arms is larger than that between the first and second catch projections.

4. A cooling apparatus for cooling an object, using the fan according to claim 1, comprising:
   a heat sink attached to the object; and
   the fan attached to the heat sink, wherein
   the first and second catch projections catch a portion of the heat sink.

5. A cooling apparatus according to claim 4, wherein the heat sink includes a base and a number of fins standing on the base, wherein the base has screw holes between the first and second holding arms, and wherein the heat sink is capable of being attached to the object with screws inserted in the screw holes.

6. A cooling apparatus according to claim 5, wherein the first and second catch projections catch a lower portion of the heat sink.

* * * * *